United States Patent
Lee et al.

(10) Patent No.: US 10,691,017 B2
(45) Date of Patent: *Jun. 23, 2020

(54) PELLICLE FOR ADVANCED LITHOGRAPHY

(71) Applicant: Taiwan Semiconductor Manufacturing Company, Ltd., Hsin-Chu (TW)

(72) Inventors: Yu-Ching Lee, Kaohsiung (TW); Ching-Fang Yu, Hsinchu (TW); Chun-Hung Lin, Taoyuan (TW); Ting-Hao Hsu, Hsinchu (TW); Ching-Hsiang Chang, Taipei (TW); Sheng-Chi Chin, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/181,637

(22) Filed: Nov. 6, 2018

(65) Prior Publication Data

US 2019/0072849 A1 Mar. 7, 2019

Related U.S. Application Data

(63) Continuation of application No. 15/019,478, filed on Feb. 9, 2016, now Pat. No. 10,126,644.

(51) Int. Cl.
*G03F 1/64* (2012.01)
*G03F 7/20* (2006.01)

(52) U.S. Cl.
CPC .............. *G03F 1/64* (2013.01); *G03F 7/2004* (2013.01)

(58) Field of Classification Search
CPC ..................................... G03F 1/64; G03F 1/32
USPC .............................................................. 430/5
See application file for complete search history.

(56) References Cited

U.S. PATENT DOCUMENTS

| | | | |
|---|---|---|---|
| 6,103,427 A | 8/2000 | Storm | |
| 6,623,893 B1 | 9/2003 | Levinson et al. | |
| 10,126,644 B2 * | 11/2018 | Lee | G03F 7/2004 |
| 2011/0117482 A1 | 5/2011 | Hamada | |

FOREIGN PATENT DOCUMENTS

JP 2016-006481 1/2016

\* cited by examiner

*Primary Examiner* — Daborah Chacko-Davis
(74) *Attorney, Agent, or Firm* — Haynes and Boone, LLP

(57) ABSTRACT

Pellicle-mask systems for advanced lithography, such as extreme ultraviolet lithography, are disclosed herein. An exemplary pellicle-mask system includes a mask having an integrated circuit (IC) pattern, a pellicle membrane, and a pellicle frame. The pellicle frame has a first surface attached to the pellicle membrane and a second surface opposite the first surface attached to the mask, such that the IC pattern of the mask is positioned within an enclosed space defined by the mask, the pellicle membrane, and the pellicle frame. A void is defined between the pellicle frame and the mask, where the void is defined by a portion of the second surface of the pellicle membrane not attached to the mask. The void is not in communication with the enclosed space and is not in communication with an exterior space of the pellicle-mask system.

20 Claims, 13 Drawing Sheets

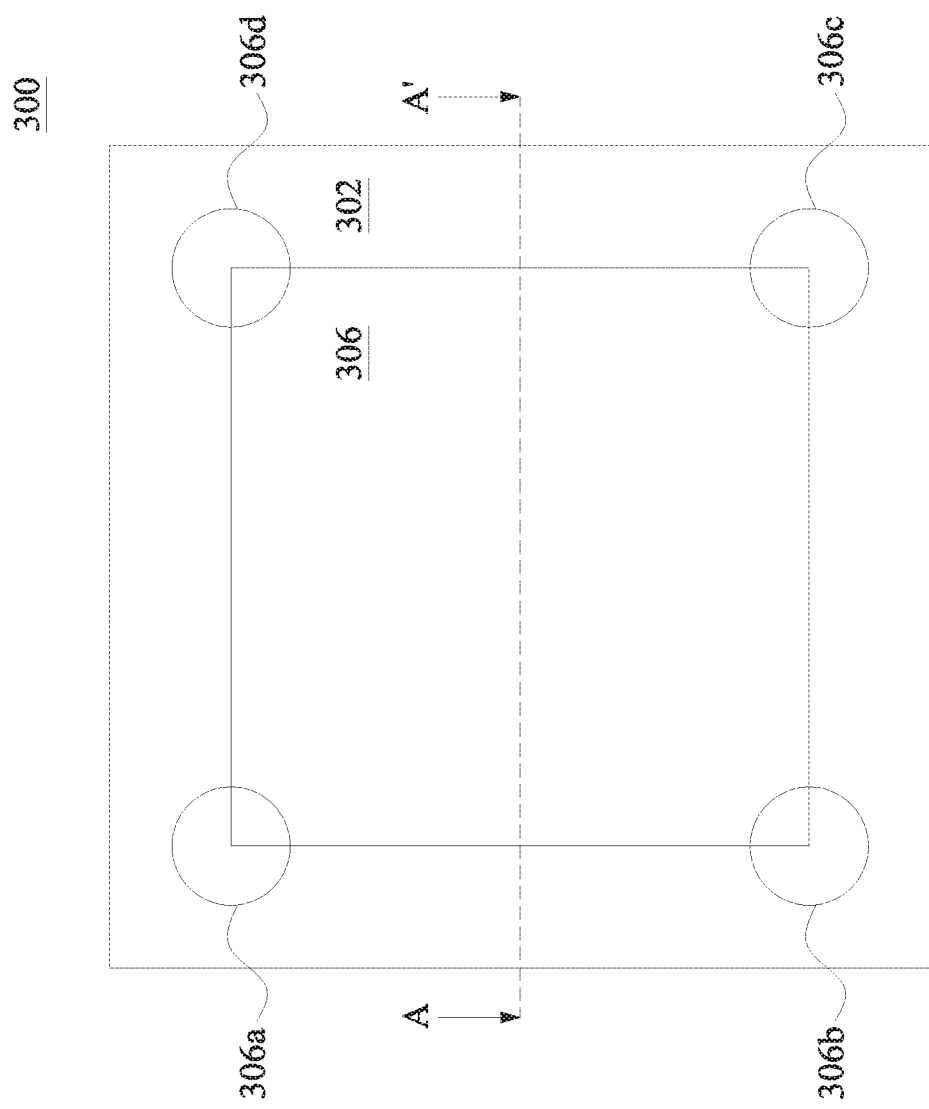

PELLICLE FOR ADVANCED LITHOGRAPHY

The present application is a continuation application of U.S. patent application Ser. No. 15/019,478, filed Feb. 9, 2016, now U.S. Pat. No. 10,126,644, which is hereby incorporated by reference in its entirety.

BACKGROUND

In semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. Although existing IC devices and methods of fabricating IC devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, and 3C are a top-view, a perspective view, and a cross-sectional view along line A-A', respectively, of a mask pellicle system, in accordance with some embodiments.

DETAILED DESCRIPTION

Figure 1:
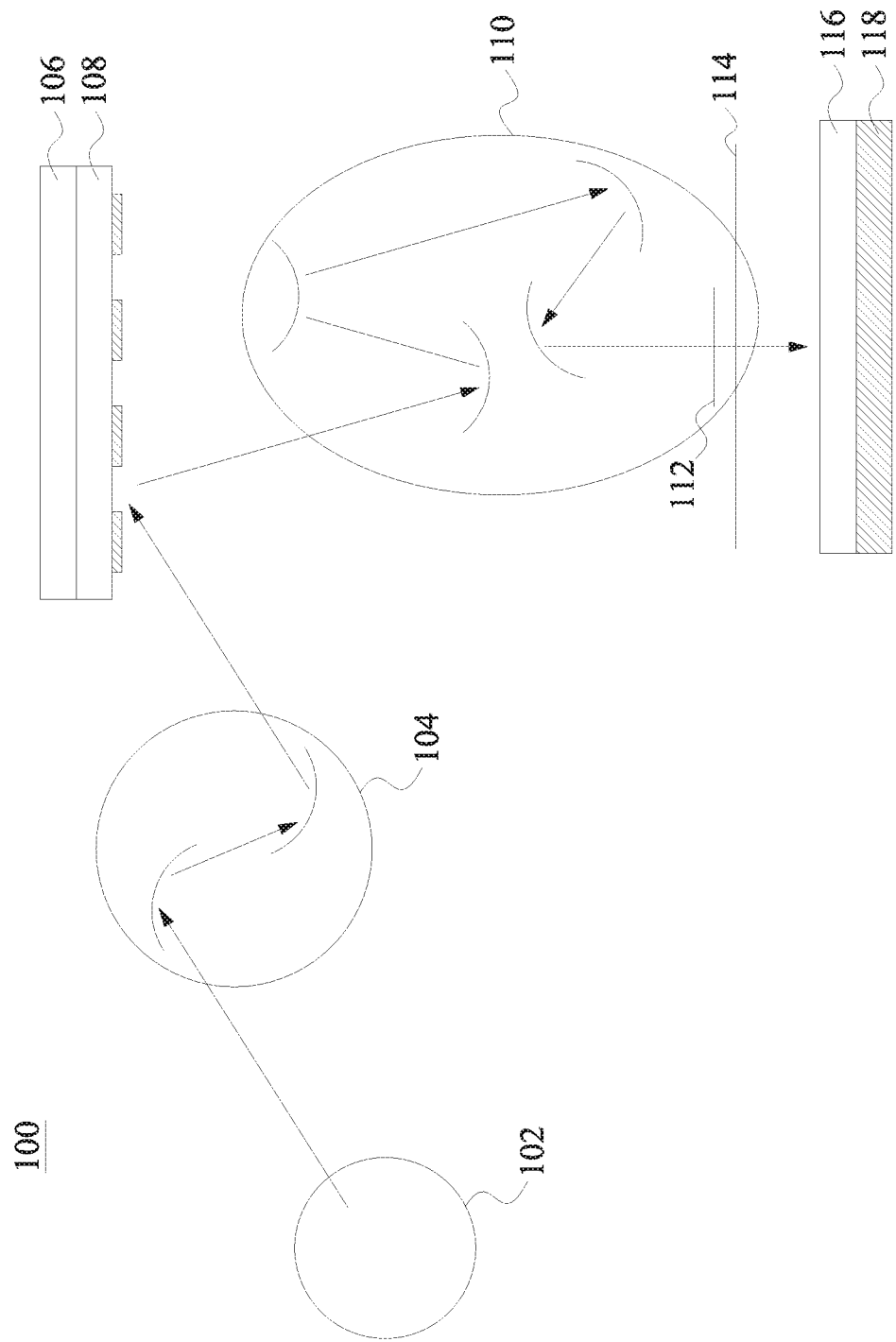
FIG. 1 is a schematic view of a lithography system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to improvements in photolithography processing. A photolithography process forms a patterned resist layer for various patterning processes, such as etching or ion implantation. The minimum feature size that may be patterned by way of such a lithography process is limited by the wavelength of the projected radiation source. Lithography machines have gone from using ultraviolet light with a wavelength of 365 nanometers to using deep ultraviolet (DUV) light including a krypton fluoride laser (KrF laser) of 248 nanometers and an argon fluoride laser (ArF laser) of 193 nanometers, and to using extreme ultraviolet (EUV) light of a wavelength of 13.5 nanometers, improving the resolution at every step.

In the photolithography process, a photomask (or mask) is used. The mask includes a substrate and a patterned layer that defines an integrated circuit to be transferred to a semiconductor substrate during the photolithography process. The mask is typically included with a pellicle assembly, collectively referred to as a mask system. The pellicle assembly includes a transparent thin membrane and a pellicle frame, where the membrane is mounted over a pellicle frame. The pellicle protects the mask from fallen particles and keeps the particles out of focus so that they do not produce a patterned image, which may cause defects when the mask is being used. The membrane is typically stretched and mounted over the pellicle frame, and is attached to the pellicle frame by glue or other adhesives. An internal space may be formed by the mask, the membrane, and the pellicle frame. Deficiencies in balancing the pressure difference between the internal and external pressure may cause the membrane to become distorted, wrinkled, broken, or otherwise damaged, thereby rendering the mask pellicle system unusable. Thus, existing techniques for fabricating mask pellicle systems have not proved entirely satisfactory in all aspects. The present disclosure is directed to systems and methods for improving mask pellicle systems.

Illustrated in FIG. 1 is a schematic view of a lithography system 100, in accordance with some embodiments. The lithography system 100 may also be generically referred to as a scanner that is operable to perform lithographic processes including exposure with a respective radiation source and in a particular exposure mode. In at least some embodiments, the lithography system 100 includes an extreme ultraviolet (EUV) lithography system designed to expose a resist layer by EUV light. The lithography system 100 of FIG. 1 includes a plurality of subsystems such as a radiation source 102, an illuminator 104, a mask stage 106 configured to receive a mask 108, projection optics 110, and a substrate stage 118 configured to receive a semiconductor substrate 116.

A general description of the operation of the lithography system 100 may be given as follows: EUV light from the radiation source 102 is directed toward the illuminator 104 (which includes a set of reflective mirrors) and projected onto the reflective mask 108. A reflected mask image is directed toward the projection optics 110, which focuses the EUV light and projects the EUV light onto the semiconductor substrate 116 to expose an EUV resist layer deposited thereupon. Additionally, in various examples, each subsystem of the lithography system 100 may be housed in, and thus operate within, a high-vacuum environment, for example, to reduce atmospheric absorption of EUV light.

In the embodiments described herein, the radiation source 102 may be used to generate the EUV light. In some embodiments, the radiation source 102 includes a plasma source, such as for example, a discharge produced plasma (DPP) or a laser produced plasma (LPP). In some examples, the EUV light may include light having a wavelength ranging from about 1 nm to about 100 nm. In one particular example, the radiation source 102 generates EUV light with a wavelength centered at about 13.5 nm. Accordingly, the radiation source 102 may also be referred to as an EUV radiation source 102. In some embodiments, the radiation source 102 also includes a collector, which may be used to collect EUV light generated from the plasma source and to direct the EUV light toward imaging optics such as the illuminator 104.

As described above, light from the radiation source 102 is directed toward the illuminator 104. In some embodiments, the illuminator 104 may include reflective optics (e.g., for the EUV lithography system 100), such as a single mirror or a mirror system having multiple mirrors in order to direct light from the radiation source 102 onto the mask stage 106, and particularly to the mask 108 secured on the mask stage 106. In some examples, the illuminator 104 may include a zone plate, for example, to improve focus of the EUV light. In some embodiments, the illuminator 104 may be configured to shape the EUV light passing therethrough in accordance with a particular pupil shape, and including for example, a dipole shape, a quadrapole shape, an annular shape, a single beam shape, a multiple beam shape, and/or a combination thereof. In some embodiments, the illuminator 104 is operable to configure the mirrors (i.e., of the illuminator 104) to provide a desired illumination to the mask 108. In one example, the mirrors of the illuminator 104 are configurable to reflect EUV light to different illumination positions. In some embodiments, a stage prior to the illuminator 104 may additionally include other configurable mirrors that may be used to direct the EUV light to different illumination positions within the mirrors of the illuminator 104. In some embodiments, the illuminator 104 is configured to provide an on-axis illumination (ONI) to the mask 108. In some embodiments, the illuminator 104 is configured to provide an off-axis illumination (OAI) to the mask 108. It should be noted that the optics employed in the EUV lithography system 100, and in particular optics used for the illuminator 104 and the projection optics 110, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 100 also includes the mask stage 106 configured to secure the mask 108. Since the lithography system 100 may be housed in, and thus operate within, a high-vacuum environment, the mask stage 106 may include an electrostatic chuck (e-chuck) to secure the mask 108. As with the optics of the EUV lithography system 100, the mask 108 is also reflective. Details of the mask 108 are discussed in more detail below with reference to FIG. 2. As illustrated in FIG. 1, light is reflected from the mask 108 and directed towards the projection optics 110, which collects the EUV light reflected from the mask 108. By way of example, the EUV light collected by the projection optics 110 (reflected from the mask 108) carries an image of the pattern defined by the mask 108. In various embodiments, the projection optics 110 provides for imaging the pattern of the mask 108 onto the semiconductor substrate 116 secured on the substrate stage 118 of the lithography system 100. In particular, in various embodiments, the projection optics 110 focuses the collected EUV light and projects the EUV light onto the semiconductor substrate 116 to expose an EUV resist layer deposited on the semiconductor substrate 116. As described above, the projection optics 110 may include reflective optics, as used in EUV lithography systems such as the lithography system 100. In some embodiments, the illuminator 104 and the projection optics 110 are collectively referred to as an optical module of the lithography system 100.

As discussed above, the lithography system 100 also includes the substrate stage 118 to secure the semiconductor substrate 116 to be patterned. In various embodiments, the semiconductor substrate 116 includes a semiconductor wafer, such as a silicon wafer, germanium wafer, silicon-germanium wafer, III-V wafer, or other type of wafer as known in the art. The semiconductor substrate 116 may be coated with a resist layer (e.g., an EUV resist layer) sensitive to EUV light. EUV resists may have stringent performance standards. For purposes of illustration, an EUV resist may be designed to provide at least around 22 nm resolution, at least around 2 nm line-width roughness (LWR), and with a sensitivity of at least around 15 mJ/cm$^2$. In the embodiments described herein, the various subsystems of the lithography system 100, including those described above, are integrated and are operable to perform lithography exposing processes including EUV lithography processes. To be sure, the lithography system 100 may further include other modules or subsystems which may be integrated with (or be coupled to) one or more of the subsystems or components described herein.

The lithography system may include other components and may have other alternatives. In some embodiments, the lithography system 100 may include a pupil phase modulator 112 to modulate an optical phase of the EUV light directed from the mask 108, such that the light has a phase distribution along a projection pupil plane 114. In some embodiments, the pupil phase modulator 112 includes a mechanism to tune the reflective mirrors of the projection optics 110 for phase modulation. For example, in some embodiments, the mirrors of the projection optics 110 are configurable to reflect the EUV light through the pupil phase modulator 112, thereby modulating the phase of the light through the projection optics 110. In some embodiments, the pupil phase modulator 112 utilizes a pupil filter placed on the projection pupil plane 114. By way of example, the pupil filter may be employed to filter out specific spatial frequency components of the EUV light reflected from the mask 108. In some embodiments, the pupil filter may serve as a phase pupil filter that modulates the phase distribution of the light directed through the projection optics 110.

Figure 2:
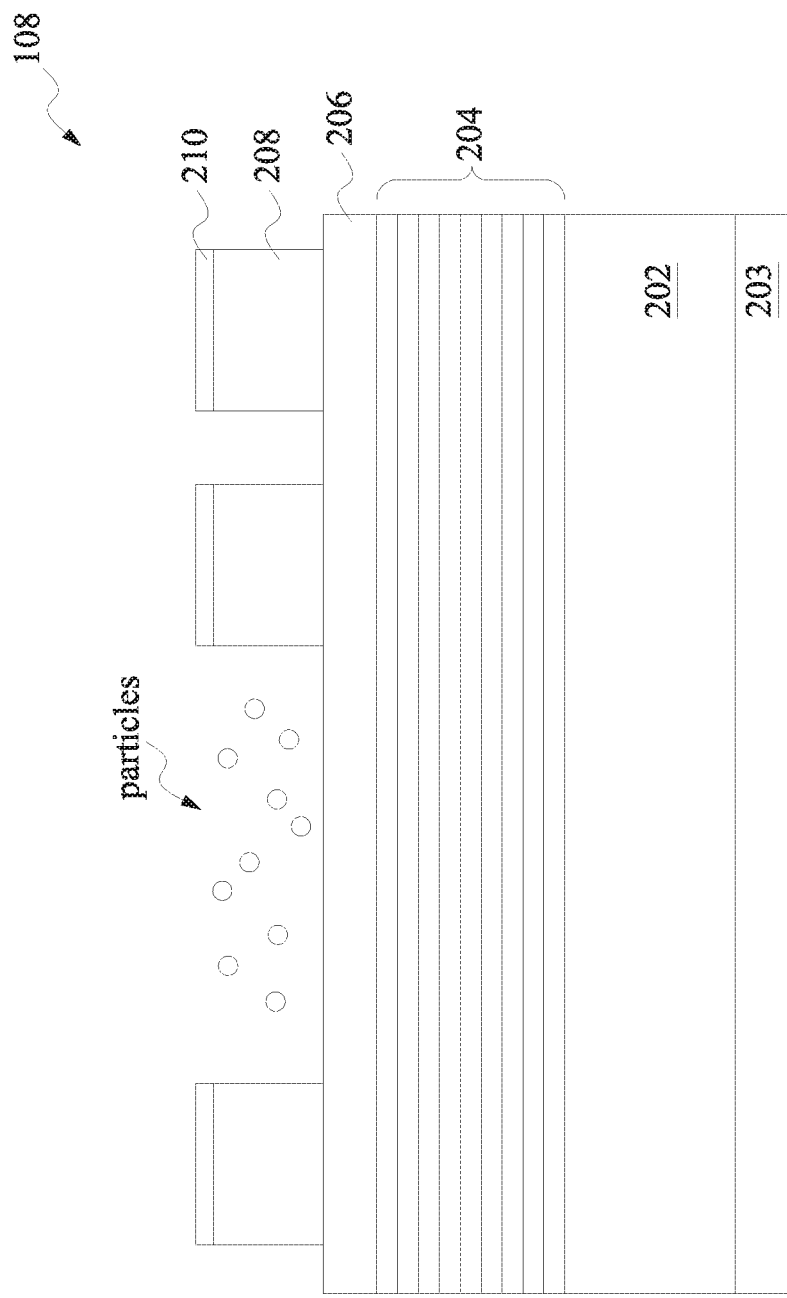
FIG. 2 is a cross-section of a mask, in accordance with some embodiments.

Returning to the mask 108, and with reference to FIG. 2, illustrated therein is an example cross-section of the EUV mask 108 of FIG. 1. As shown in FIG. 2, the EUV mask 108 may include a substrate 202 having a backside coating layer 203, a multi-layer structure 204, a capping layer 206, and one or more absorbers 208 having an anti-reflective coating (ARC) layer 210. In some embodiments, the substrate 202 includes a low thermal expansion material (LTEM) substrate (e.g., such as $TiO_2$ doped $SiO_2$), and the backside coating layer 203 includes a chromium nitride ($Cr_xN_y$) layer. In some examples, substrate 202 has a thickness of about 6.3 to about 6.5 mm. In some examples, the backside coating 203 has a thickness of about 70 nm to about 100 nm. By way of example, the multi-layer structure 204 may include alternating layers of molybdenum-silicon (Mo—Si) deposited on top of the substrate 202 for example, using an ion deposition technique. In some embodiments, the multi-layer structure 204 has a thickness of about 250-350 nm, and in some examples each Mo—Si layer pair has a thickness of about 3 nm (for the Mo layer) and about 4 nm (for the Si layer). In various embodiments, the capping layer 206 includes a ruthenium (Ru) capping layer, which in some examples may have a thickness of about 2.5 nm. In some embodiments, the capping layer 206 may include a Si capping layer having a thickness of about 4 nm. The capping layer 206 may help to protect the multi-layer structure 204 (e.g., during fabrication of the mask 108) and may also serve as an etch-stop layer for a subsequent absorber layer etch process. In some embodiments, the absorbers 208 may include for example, a $Ta_xN_y$ layer or a $Ta_xB_yO_zN_u$ layer, which may have a thickness of about 50 nm to about 75 nm and are configured to absorb EUV light (e.g., with a wavelength of about 13.5 nm). In some examples, other materials may be used for the absorbers 208, such as Al, Cr, Ta, and W, among others. In some examples, the ARC layer 210 includes at least one of a $Ta_xB_yO_zN_u$ layer, a $Hf_xO_y$ layer, or a $Si_xO_yN_z$ layer.

For purposes of illustration, an exemplary fabrication method for the mask 108 is herein described. In some embodiments, the fabrication process includes two process stages: (1) a mask blank fabrication process, and (2) a mask patterning process. During the mask blank fabrication process, the mask blank is formed by depositing suitable layers (e.g., reflective multiple layers such as Mo—Si multi-layers) on a suitable substrate (e.g., an LTEM substrate having a flat, defect free surface). In various embodiments, the surface roughness of the mask blank is less than about 50 nm. By way of example, a capping layer (e.g., ruthenium) is formed over the multilayer coated substrate followed by deposition of an absorber layer. The mask blank may then be patterned (e.g., the absorber layer is patterned) to form a desired pattern on the mask 108. In some embodiments, an ARC layer may be deposited over the absorber layer prior to patterning the mask blank. The patterned mask 108 may then be used to transfer circuit and/or device patterns onto a semiconductor wafer. In various embodiments, the patterns defined by the mask 108 can be transferred over and over onto multiple wafers through various lithography processes. In addition, a set of masks (such as the mask 108) may be used to construct a complete integrated circuit (IC) device and/or circuit.

In various embodiments, the mask 108 (described above) may be fabricated to include different structure types such as, for example, a binary intensity mask (BIM) or a phase-shifting mask (PSM). An illustrative BIM includes opaque absorbing regions and reflective regions, where the BIM includes a pattern (e.g., and IC pattern) to be transferred to the semiconductor substrate 116. The opaque absorbing regions include an absorber, as described above, that is configured to absorb incident light (e.g., incident EUV light). In the reflective regions, the absorber has been removed (e.g., during the mask patterning process described above) and the incident light is reflected by the multi-layer. Additionally, in some embodiments, the mask 108 may be a PSM which utilizes interference produced by phase differences of light reflected therefrom. Examples of PSMs include an alternating PSM (AltPSM), an attenuated PSM (AttPSM), and a chromeless PSM (cPSM). By way of example, an AltPSM may include phase shifters (of opposing phases) disposed on either side of each patterned mask feature. In some examples, an AttPSM may include an absorber layer having a transmittance greater than zero (e.g., Mo—Si having about a 6% intensity transmittance). In some cases, a cPSM may be described as a 100% transmission AltPSM, for example, because the cPSM does not include phase shifter material or chrome on the mask. In some illustrative embodiments of a PSM, the patterned layer 208 is reflective layer with a material stack similar to that of the multi-layer structure 204.

As described above, the mask 108 includes a patterned image that may be used to transfer circuit and/or device patterns onto a semiconductor wafer (e.g., the semiconductor substrate 116) by the lithography system 100. To achieve a high fidelity pattern transfer from the patterned mask 108 to the semiconductor substrate 116, the lithography process should be defect free. As shown in FIG. 2, particles may be unintentionally deposited on the surface of the capping layer 206 and can result in degradation of lithographically transferred patterns if not removed. Particles may be introduced by any of a variety of methods such as during an etching process, a cleaning process, and/or during handling of the EUV mask 108. Accordingly, the mask 108 is integrated in a pellicle assembly and is protected by the pellicle assembly to reduce particle induced defects from occurring. The mask and the pellicle assembly are collectively referred to as a mask-pellicle system. For example, during the lithography patterning process by the lithography system 100, the mask-pellicle system is secured to the mask stage 106.

Figure 3B:
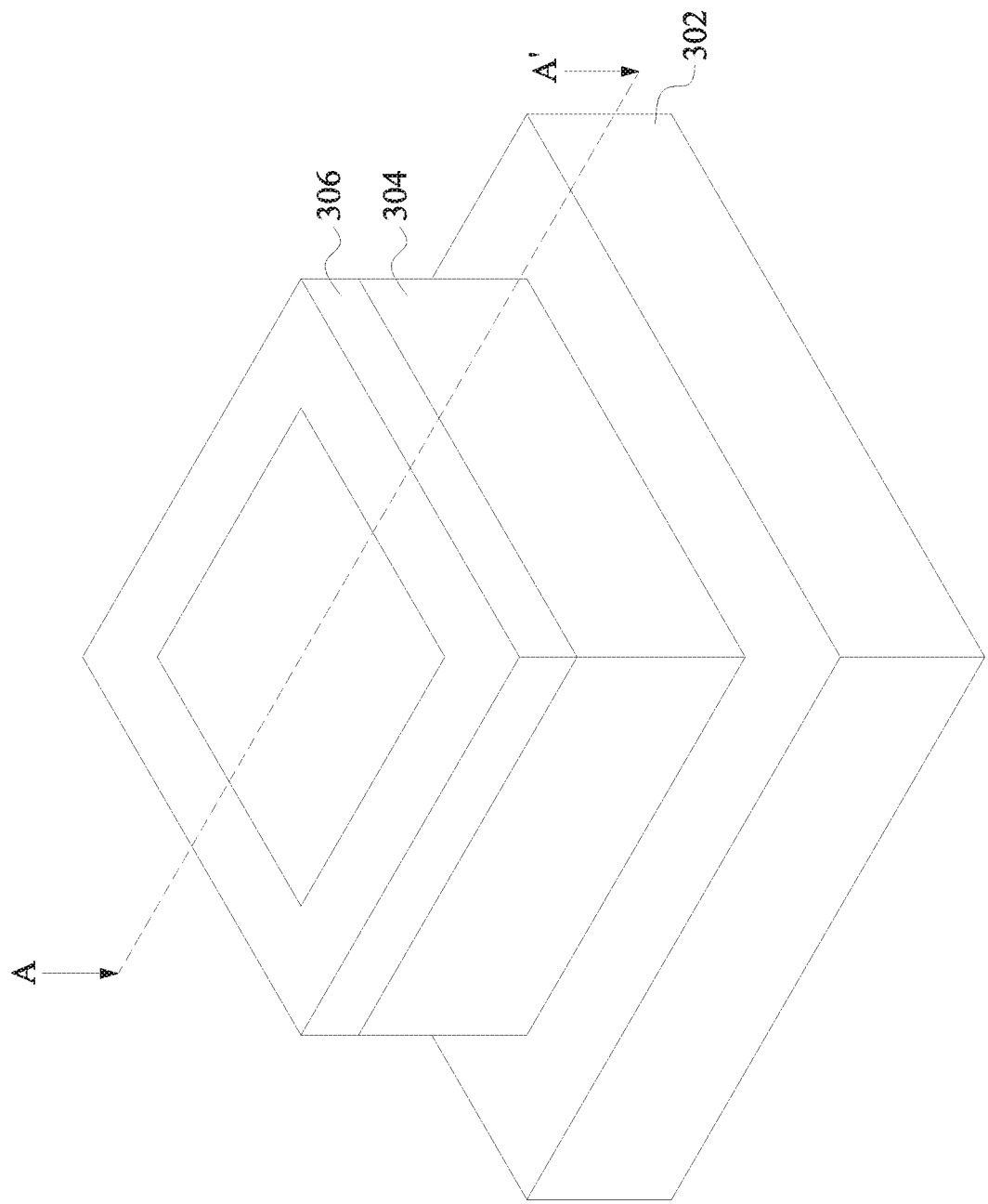
Figure 3C:
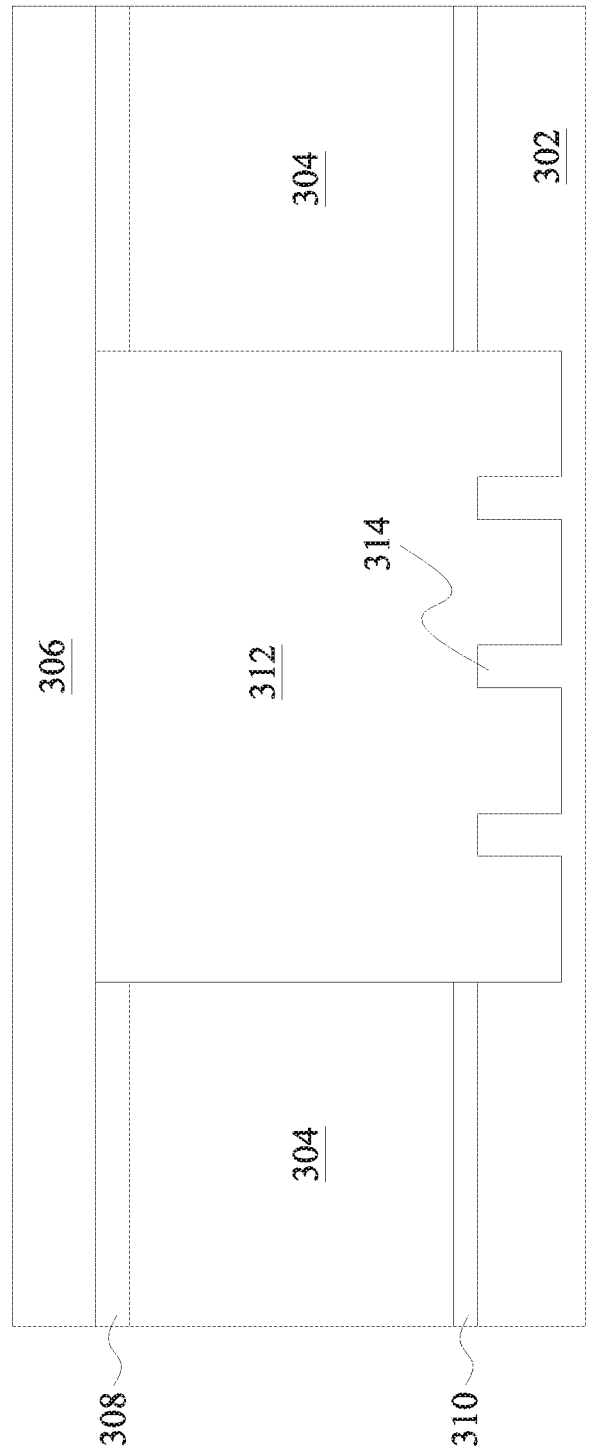

FIGS. 3A, 3B, and 3C illustrate an example of a mask-pellicle system. With reference to FIGS. 3A, 3B, and 3C, illustrated therein is a top-view, a perspective view, and a cross-sectional view along line A-A', respectively, of a mask pellicle system 300. Referring to FIGS. 3A, 3B, and 3C, the mask pellicle system 300 and a method of using the same are described.

The mask pellicle system 300 includes a mask 302, a pellicle frame 304 and a membrane integrated together through adhesive material layers 308 and 310. As discussed above, the mask 302 also includes a patterned surface 314 used to pattern a semiconductor substrate by a lithographic process. In some embodiments, the mask 302 is the same as the mask 108 as an EUV mask, as discussed above. In some other embodiments, the mask 302 may be any of a variety of (lithography) masks such as, for example, an optical mask that is used for other wavelengths (e.g., 365 nm, 248 nm, and/or 193 nm). In the present embodiment, the mask 302 is integrated in the mask pellicle system 300 and is secured on the mask stage 106 collectively with the membrane 306 and the pellicle frame 304 during a lithography patterning process.

The membrane 306 is configured proximate to the mask 302 and is attached to the pellicle frame 304 through the adhesive layer 308. Particularly, the membrane 306 is attached to the pellicle frame 304 through the adhesive material layer 308. The mask 302 is further attached to the pellicle frame 304 through the adhesive material layer 310. Thus, in some specific embodiments, the mask 302, the pellicle frame 304 and the membrane 306 are thus configured and integrated to enclose/define an internal space 312. The patterned surface 314 of the mask 302 is enclosed in the internal space 312 and is therefore protected from contamination during a lithography patterning process, mask shipping, and mask handling. However, in some alternative embodiments, the pellicle frame may be implemented as four pillars/columns that are each located at corner of the membrane (as shown 306a, 306b, 306c, and 306d in FIG. 3A) and thus configured to secure the membrane 306 over the mask 302. In such an example of the pellicle frame being implemented as a plurality of pillars/columns, a semi-enclosed space 312 may be defined by the membrane 306 and the pillars 306a, 306b, 306c, and 306d. Further, this semi-enclosed space 312 may be surrounded by the pillars and a plurality of gaps that are located between the membrane 306 and the mask 302.

The membrane 306 is made of a thin film transparent to the radiation beam used in a lithography patterning process, and furthermore has a thermal conductive surface. In some embodiments, the membrane is formed of a material that is selected from the group consisting of pSi, a-Si, SiCN, and SiP Graphene. The membrane 306 is also configured proximate to a patterned surface 314 on the mask 302 as illustrated in FIG. 3C. In various embodiments, the membrane 306 includes a transparent material layer with a thermal conductive film on one surface (or both surfaces).

The mask pellicle system 300 also includes a pellicle frame 304 configured such that the membrane 306 can be attached and secured to the pellicle frame 304. The pellicle frame 304 may be designed in various dimensions, shapes, and configurations. Among those and other alternatives, the pellicle frame 304 may have one single component or multiple components. The pellicle frame 304 includes a material with mechanical strength, and designed in a shape, dimensions, and a configuration so as to secure the membrane 306 properly across the pellicle frame 304. In some embodiments, the pellicle frame 304 may be entirely formed by a porous material. In some examples, the pellicle frame 304 may be uniformly continuous. A pellicle assembly may include a pellicle frame 304 and a membrane 306 attached to the pellicle frame 304.

Conventionally, a pellicle frame generally includes a substantially flat surface that is parallel to a top surface of a mask (i.e., the top surface that includes a mask pattern and that is to be mounted by a pellicle frame). Such conventional pellicle frames may encounter a variety of issues such as unintentional particles (commonly regarded as "contamination(s)") flowing through a gap between the substantially flat surface of the pellicle frame and the top surface of the mask. More specifically, during the process of the mounting the membrane (more precisely, mounting the pellicle frame) to the mask, a gradually decreasing gap exists between the pellicle frame and the top surface of the mask and eventually becomes absent (becomes "0") after the pellicle frame is mounted to the mask (to the top surface of the mask). In general, due to air-flow mechanism, such a gradually decreasing gap enables a particle (generally has a size less than 1 μm) to flow from an outer side of the pellicle frame to an inner side of the pellicle frame where a pattern of the mask is located (e.g., 314).

In the current embodiments, the pellicle frame 304 includes at least one groove on a surface (401) that is to be attached to the mask 302, as illustrated in FIGS. 4A, 4B, 4C, 4D, 4E, and 4F. In particular, such grooves may be implemented in a variety of shapes such as, for example, a symmetrically curvilinear shape, a symmetrically polygonal shape, and/or an asymmetrically curvilinear shape. By including such a groove on the surface 401 of the pellicle frame 304, during the mounting process as described above, any particle that intends to flow or already flew into the inner side of the pellicle frame may be trapped in the groove. As such, the particle that generally causes contamination(s) on the pattern of the mask using conventional pellicle frame may be advantageously avoided in the current embodiments in which the pellicle frame includes at least one groove.

Figure 4A:
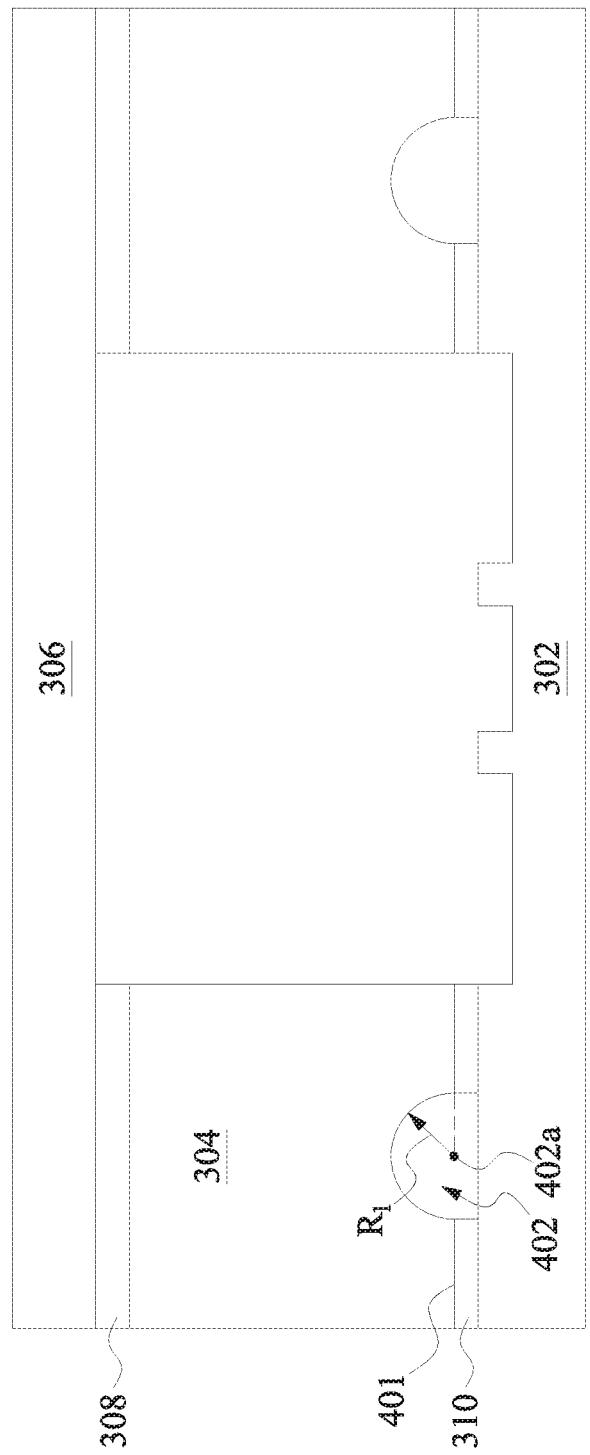
FIGS. 4A, 4B, 4C, 4D, 4E, and 4F are sectional views of a pellicle frame, in accordance with some embodiments.
Figure 4B:
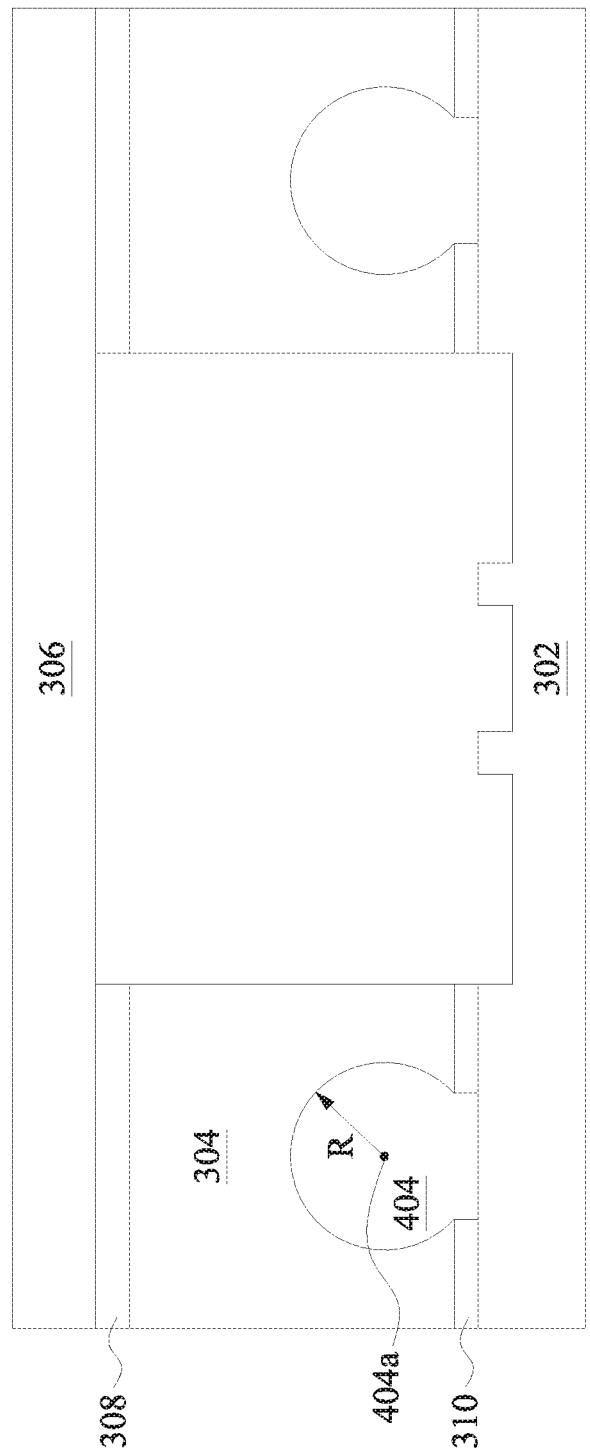

More specifically, FIGS. 4A-4F are each a cross-sectional view of the pellicle-mask system 300, in portion, constructed in accordance with some embodiments. In the illustrated embodiments of FIGS. 4A and 4B, the pellicle frame 304 includes a symmetrically curvilinear groove, which is respectfully shown as 402 in FIG. 4A and as 404 in FIG. 4B. In FIG. 4A, the groove 402 is a semi-circle that includes a circle center 402a directly aligned with the surface of the pellicle frame 401. Furthermore, the semi-circle groove 402 includes a radius R1 as shown in FIG. 4A. In FIG. 4B, the groove 404 is a portion of a circle that has a circle center 404a aligned above the surface 401 and a radius R2. In some specific embodiments, the radiuses R1 and R2 each ranges between about 1 μm to about 1 mm. In some alternative embodiments, the groove 404 may be implemented as a portion of a circle that has a circle center aligned below the surface 401 (not shown).

Figure 4C:
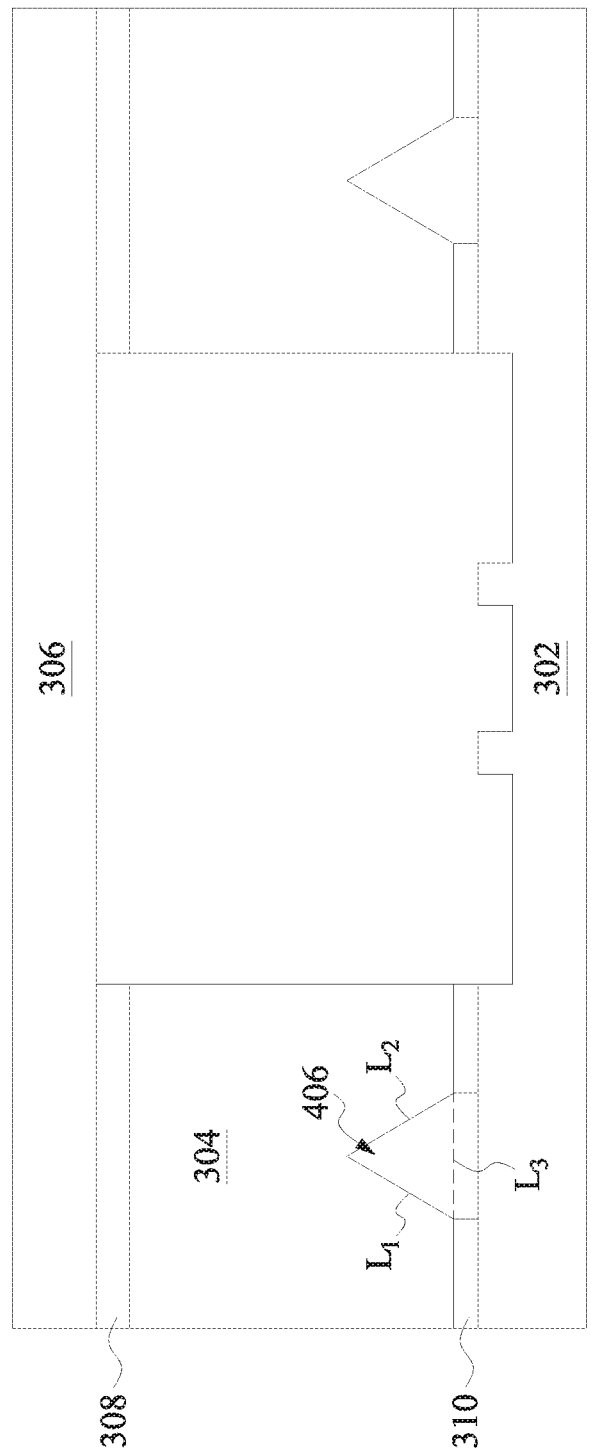

In the illustrated embodiment of FIG. 4C, the pellicle frame 304 includes a symmetrically polygonal groove 406. In the specific embodiment of FIG. 4C, the symmetrically polygonal groove 406 is a triangular shape that includes edges L1, L2, and L3. In some specific embodiments, the edges L1, L2, and L3 each ranges between about 1 μm to about 1 mm. Although the symmetrically polygonal groove 406 is implemented as a triangular shape in FIG. 4C, any of a variety of polygonal shapes (e.g., a quadrilateral, a polygon, a pentagon, a hexagon, etc.) or a portion of a polygonal shape may be used for the groove 406 while remaining within the scope of the present disclosure.

Figure 4D:
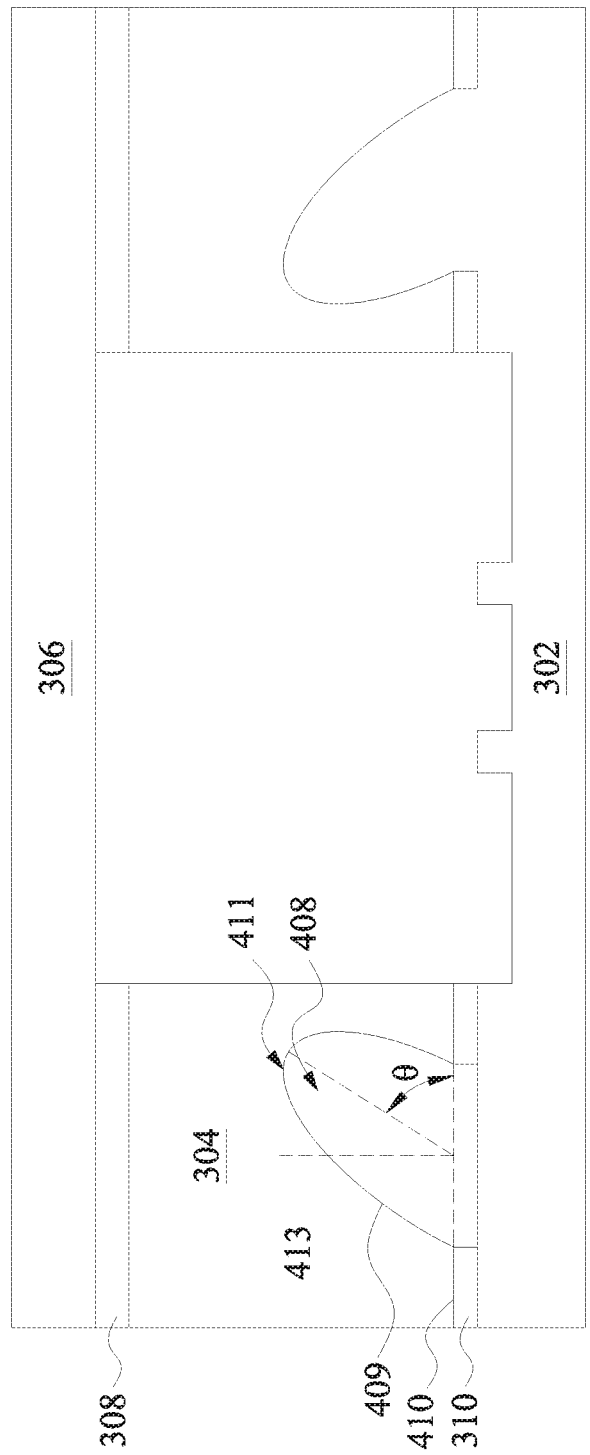

In the illustrated embodiment of FIG. 4D, the pellicle frame 304 includes an asymmetrically curvilinear groove 408 that is a portion of a tilted elliptical shape. More particularly, such a tilted elliptical groove 408 has a semi-major axis 409 and the semi-major axis 409 is counterclockwise tilted from the surface 401 with an angle whereby this angle is less than about 90 degrees. As such, the tilted elliptical groove 408 may further include a first portion 411 that is relatively closer to the inner side of the pellicle frame 304 and a second portion 413 that is relatively closer to the outer side of the pellicle frame 304 whereby the first portion 411 has a larger area than the second portion 413.

Figure 4E:
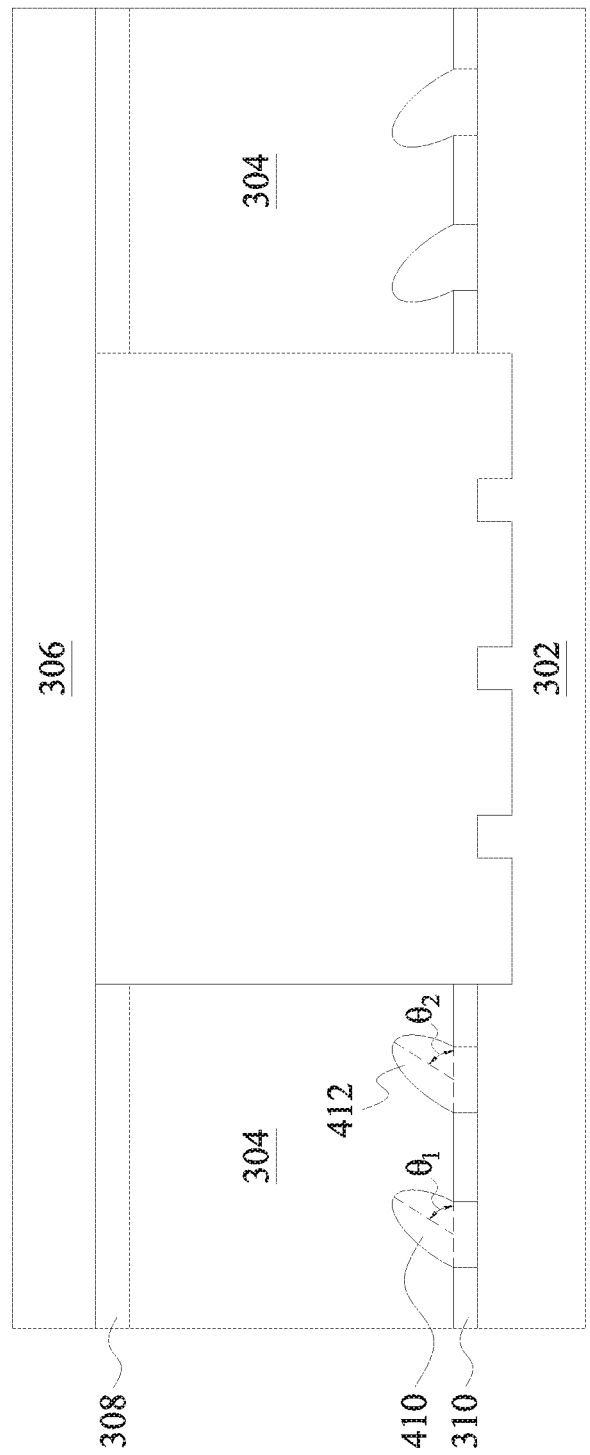
Figure 4F:
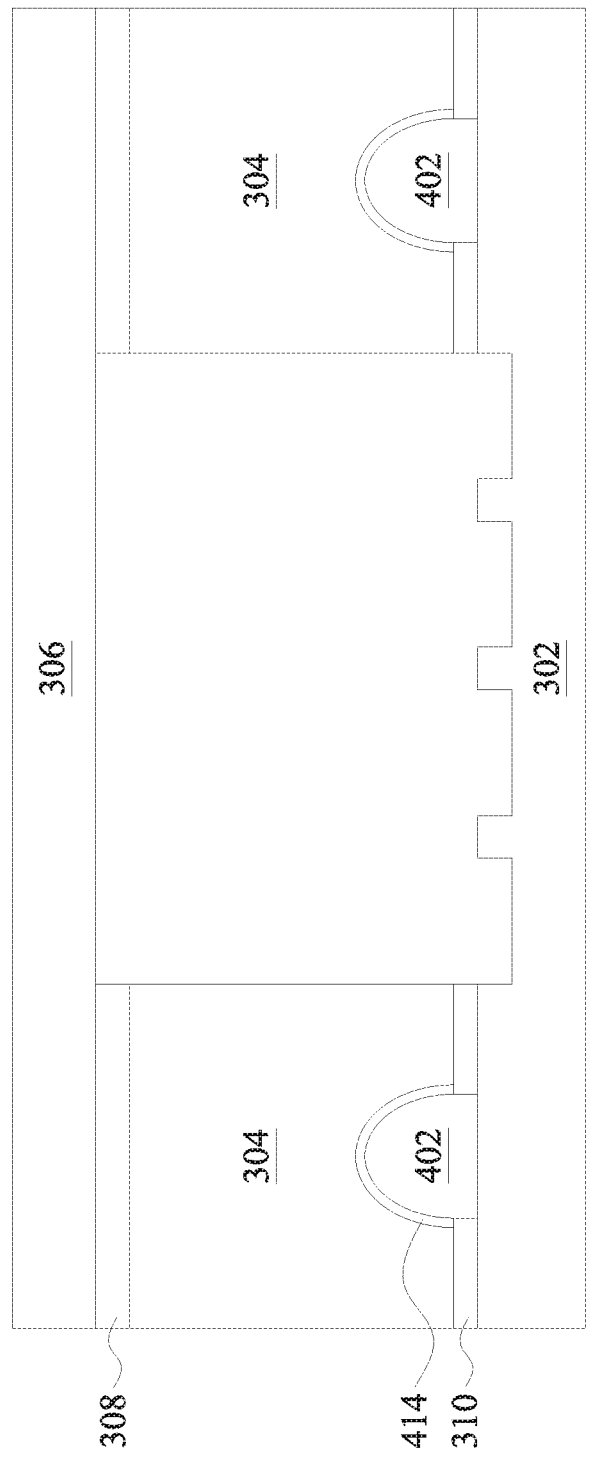

As a further embodiment of the present disclosure, the pellicle frame 304 includes more than one grooves, which is illustrated in FIG. 4E that includes two tilted elliptical grooves 410 and 412. Each of the grooves 410 and 412 may be counterclockwise tilted from the surface 401 with an angle $\theta_1$ and $\theta_2$ respectively. In some specific embodiments, each of the angles $\theta_1$ and $\theta_2$ may be less than 90 degrees. Alternatively or additionally, an adhesive layer may be formed on a surface of a groove of a pellicle frame, which is as illustrated in FIG. 4F. FIG. 4F shows that the pellicle frame 304 includes a semi-circular groove 402 and further, an adhesive layer 414 is formed over the surface of the semi-circular groove 402. In some specific embodiments, such adhesive layer 414 may be designed and configured to cause the particles trapped in the groove to be firmly attached to the surface of the groove 402.

In addition to the groove feature as described above, the pellicle frame may include a material that is chosen to have other characteristic, such as thermal conductive, high mechanical strength, and/or light weight. The material of the pellicle frame 304 may include metal, alloy or ceramic material. In some embodiments, the material of the pellicle frame 304 includes Al, $SiO_2$, Al—Mg, Al—Ti, Al—Ni and Al—Fe, AlN, Al$_2$O$_3$, ZrO$_2$, and BN, BC, or a combination thereof. The pellicle-frame-forming process includes forming a pellicle frame material and shaping the pellicle frame material to form the pellicle frame 304 with at least one groove. In some embodiments, the shaping of the pellicle frame material includes injection molding, compress molding, convention lather process, milling machine, laser dicing or a combination thereof. In some embodiments, the forming of the pellicle frame material and the shaping of the pellicle frame material to the pellicle frame with a groove may be combined to be implemented simultaneously or overlapped instead of sequentially.

Figure 5:
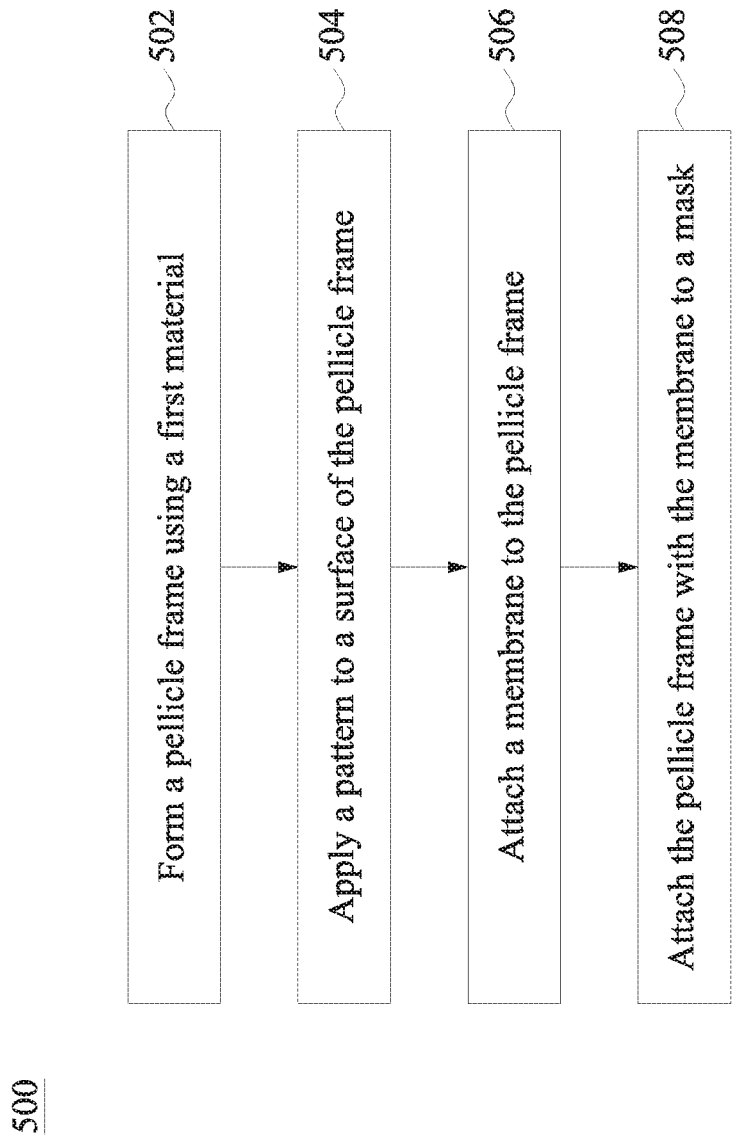
FIG. 5 is a flowchart of a method constructed in accordance with some embodiments.

Referring now to FIG. 5, a flowchart of an embodiment of a method 500 used to fabricate a pellicle assembly is illustrated. The method 500 may be used to fabricate a pellicle assembly such as the pellicle assemblies described above. It is understood that additional steps may be provided before, during, and after the method 500, and some of the steps described below can be replaced, re-sequenced, or eliminated, for additional embodiments of the method 500.

The method 500 begins at step 502, where a pellicle frame (e.g., the pellicle frame 304) is formed using a first material. The first material may be one or more of materials such as metal and/or alloy materials (e.g., aluminum, aluminum alloy, titanium, niobium, titanium-niobium alloy, combinations thereof), and/or other suitable materials (e.g., ceramic materials). The pellicle frame may be formed by processes including photolithography processing, wet chemical etching, and/or other suitable processes, and may be followed by an etch-back or chemical mechanical polish (CMP) process.

The method 500 then proceeds to step 504, where a pattern is applied to a selected surface of the pellicle frame. In an example, the pattern may be applied to the surface (e.g., 401) of the pellicle frame (e.g., the pellicle frame 304) as illustrated in FIGS. 4A-4F. The pattern may be applied using patterning processes such as imprinting by a dot-like stamp, imprinting by a pyramidal stamp, colloid sphere lithography, electron-beam lithography, focused-ion beam lithography, holographic lithography, argon (Ar) plasma etching, and/or direct writing laser (DWL) lithography. Specific patterns and/or specific patterning processes may be selected according to a material used as the first material, shapes of the pellicle frame, the desired pattern (e.g., symmetrically curvilinear groove(s), symmetrically polygonal groove(s), asymmetrically curvilinear groove(s) as illustrated in FIGS. 4A-4F), etc.

Referring still to FIG. 5, the method 500 then proceeds to step 506, where a membrane (e.g., the membrane 306) is attached to the pellicle frame (e.g., the pellicle frame 304) using an adhesive material layer (e.g., 308) to form a pellicle assembly with formed groove(s). The method 500 then continues to step 508 in which the pellicle assembly with formed groove(s) is attached to a mask (e.g., 302) using another adhesive material layer (e.g., 310).

Figure 6:
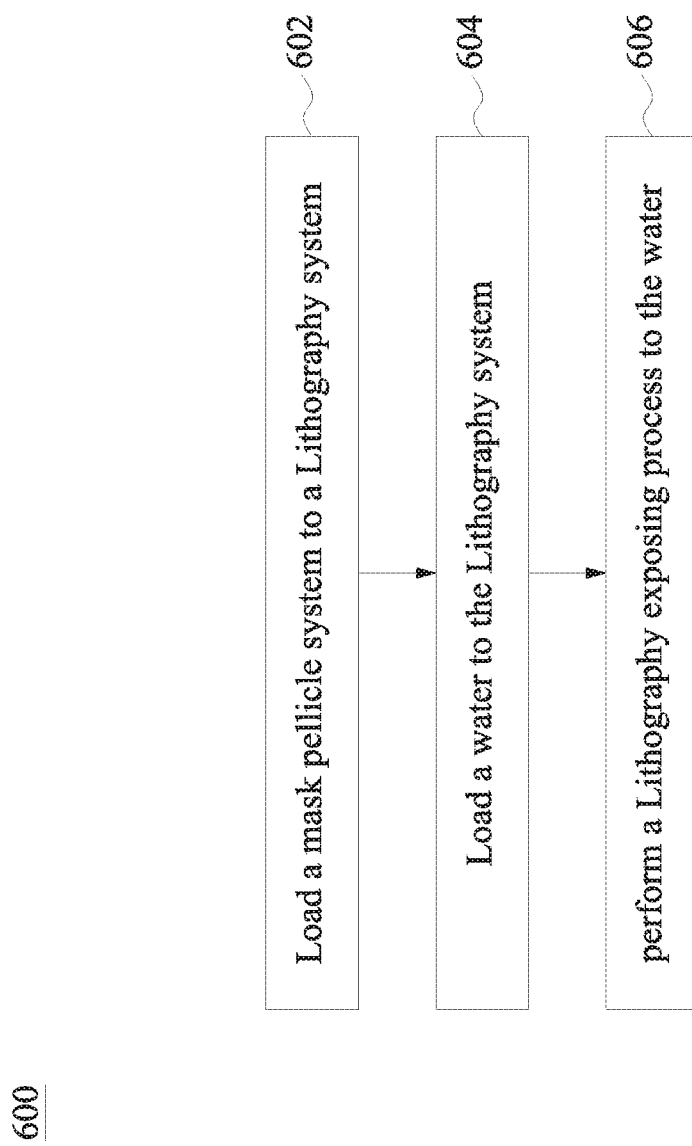
FIG. 6 is a flowchart of a method constructed in accordance with some embodiments.

Referring now to FIG. 6, illustrated is a flowchart of a method 600 used for performing a lithography process in an integrated circuit fabrication constructed according to aspects of the present disclosure in one or more embodiments. Referring conjunctively to FIGS. 1 and 3, the method 600 begins at step 602 by loading a mask pellicle system 300 to a lithography system 100. Step 602 in the method 600 may further include other steps, such as alignment after the mask pellicle system is secured on the mask stage 106.

The method 600 then proceeds to step 604, where a semiconductor wafer is loaded to the substrate stage 118 of the lithography system 100. In some examples, the semiconductor wafer may be a silicon wafer coated with a photoresist layer. The photoresist layer is to be patterned by a lithography exposure process, such that the pattern on the patterned surface 308 is transferred to the photoresist layer. The method 600 then proceeds to step 606, where a lithography exposure process transfers the pattern on the patterned surface 308 to the semiconductor wafer.

Additional steps can be provided before, during, and after the method 600, and some of the steps described can be replaced, eliminated, or moved around for additional embodiments of the method 600. In one example, the lithography process includes soft baking, mask aligning, exposing, post-exposure baking, developing photoresist, and hard baking.

Thus, the present disclosure provides a system for semiconductor lithography process, where the system includes a membrane and a pellicle frame with at least a groove securing the membrane. In an embodiment, an apparatus for a semiconductor lithography process includes a pellicle membrane; a pellicle frame attached to the pellicle membrane, wherein the pellicle frame has a surface that defines at least one groove; and a substrate that is in contact with the surface of the pellicle frame such that the grove is positioned between the pellicle frame and the substrate.

In another embodiment, a method for fabricating a pellicle assembly for a lithography process, includes forming a pellicle frame that includes a groove on a first surface of the pellicle frame; forming a pellicle membrane; and attaching the pellicle membrane to a second surface of the pellicle frame, wherein the second surface is opposite the pellicle frame from the first surface that includes the groove.

Yet in another embodiment, a method includes providing a pellicle apparatus, wherein the pellicle apparatus includes a membrane and a pellicle frame, and wherein the pellicle frame includes a first surface that is attached to the membrane and second surface opposite the first surface that includes a groove; mounting the pellicle apparatus onto a mask by coupling the second surface of the pellicle frame to the mask such that the groove faces the mask, wherein the mask includes a patterned surface; loading the mask having the pellicle apparatus mounted thereupon into a lithography system and loading a semiconductor wafer onto a substrate stage of the lithography system; and performing a lithography exposure process to transfer a pattern of the patterned surface from the mask to the semiconductor wafer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A pellicle-mask system comprising:
a mask having an integrated circuit (IC) pattern;
a pellicle membrane;
a pellicle frame having a first surface and a second surface opposite the first surface, wherein the first surface is attached to the pellicle membrane and the second surface is attached to the mask, such that the IC pattern of the mask is positioned within an enclosed space defined by the mask, the pellicle membrane, and the pellicle frame; and a void defined between the pellicle frame and the mask, wherein the void is defined by a portion of the second surface of the pellicle membrane not attached to the mask, and further wherein the void is not in communication with the enclosed space and is not in communication with an exterior space of the pellicle-mask system.

2. The pellicle-mask system of claim 1, wherein the first surface of the pellicle frame is attached to the pellicle membrane by a first adhesive layer and the second surface of the pellicle membrane is attached to the mask by a second adhesive layer.

3. The pellicle-mask system of claim 2, further comprising a third adhesive layer disposed over the portion of the second surface of the pellicle frame not attached to the mask.

4. The pellicle-mask system of claim 1, wherein the portion of the second surface of the pellicle membrane not attached to the mask is concave.

5. The pellicle-mask system of claim 1, wherein a cross-sectional shape of the void includes a portion of a circle having a center aligned with the second surface of the pellicle frame attached to the mask, a center aligned above the second surface of the pellicle frame attached to the mask, or a center aligned below the second surface of the pellicle frame attached to the mask.

6. The pellicle-mask system of claim 5, wherein a radius of the circle is about 1 µm to about 1 mm.

7. The pellicle-mask system of claim 1, wherein the void is one of a plurality of voids defined between the pellicle frame and the mask, wherein the plurality of voids is defined by portions of the second surface of the pellicle membrane not attached to the mask.

8. The pellicle-mask system of claim 7, wherein a cross-sectional shape of the plurality of voids includes a portion of an ellipse, wherein an angle between a semi-major axis of the ellipse and the second surface of the pellicle frame attached to the mask is less than about 90 degrees.

9. The pellicle-mask system of claim 1, wherein a cross-sectional shape of the void includes a polygon, wherein lengths of edges of the polygon are about 1 µm to about 1 mm.

10. The pellicle-mask system of claim 1, wherein:
the pellicle membrane includes a material that is transparent to ultraviolet light;
the pellicle frame is a patterned metal layer that includes aluminum, magnesium, titanium, nickel, iron, nitrogen, oxygen, zirconium, carbon, boron, silicon, or a combination thereof; and
the mask includes a low thermal expansion material (LTEM) substrate, a reflective multi-layer structure disposed over the LTEM substrate, and a patterned absorber layer disposed over the reflective multi-layer structure, wherein the patterned absorber layer includes a material that absorbs ultraviolet light.

11. A pellicle-mask system comprising:
a mask having an integrated circuit (IC) pattern;
a pellicle membrane;
a pellicle frame that includes a plurality of pillars, wherein each of the plurality of pillars has a first surface and a second surface opposite the first surface, wherein the first surfaces are attached to the pellicle membrane and the second surfaces are attached to the mask, such that the IC pattern of the mask is positioned within a semi-enclosed space defined by the mask, the pellicle membrane, and the pellicle frame; and a plurality of voids defined between the pellicle frame and the mask, wherein the plurality of voids is defined by portions of the second surfaces not attached to the mask, and further wherein the plurality of voids is not in communication with the semi-enclosed space and is not in communication with an exterior space of the pellicle-mask system.

12. The pellicle-mask system of claim 11, wherein the portions of the second surfaces not attached to the mask are concave portions of the second surfaces.

13. The pellicle-mask system of claim 11, wherein the portions of the second surfaces not attached to the mask are rounded.

14. The pellicle-mask system of claim 11, wherein each of the plurality of pillars are located at a corner of the pellicle membrane.

15. The pellicle-mask system of claim 11, wherein an adhesive layer is disposed along the portions of the second surfaces not attached to the mask.

16. The pellicle-mask system of claim 11, wherein:
the pellicle membrane includes a material that is transparent to ultraviolet light;
each of the plurality of pillars of the pellicle frame includes aluminum, magnesium, titanium, nickel, iron, nitrogen, oxygen, zirconium, carbon, boron, silicon, or a combination thereof; and
the mask includes a low thermal expansion material (LTEM) substrate, a reflective multi-layer structure disposed over the LTEM substrate, and a patterned absorber layer disposed over the reflective multi-layer structure, wherein the patterned absorber layer includes a material that absorbs ultraviolet light.

17. A method comprising:
providing a pellicle assembly that includes a pellicle membrane attached to a first surface of a pellicle frame, wherein the pellicle frame further includes a second surface opposite the first surface, the second surface having a concave portion; and
mounting a mask having an integrated circuit (IC) pattern to the second surface of the pellicle frame, thereby forming a pellicle-mask system that positions the IC pattern within an enclosed space defined by the mask, the pellicle membrane, and the pellicle frame, wherein:
a void is defined between the concave portion of the second surface of the pellicle frame and a portion of the mask not attached to the second surface of the pellicle frame by the mounting, and
the void is not in communication with the enclosed space and is not in communication with an exterior space of the pellicle-mask system.

18. The method of claim 17, wherein the mounting the mask includes:
forming an adhesive layer on the second surface of the pellicle frame; and
attaching the mask to the adhesive layer.

19. The method of claim 17, wherein the pellicle frame is a plurality of pillars, each of the plurality of pillars having the first surface, the second surface, and the concave portion of the second surface, such that the enclosed space is a semi-enclosed space and the void is a plurality of voids.

20. The method of claim 17, wherein the mask is an extreme ultraviolet lithography mask.

* * * * *